Figure 1:
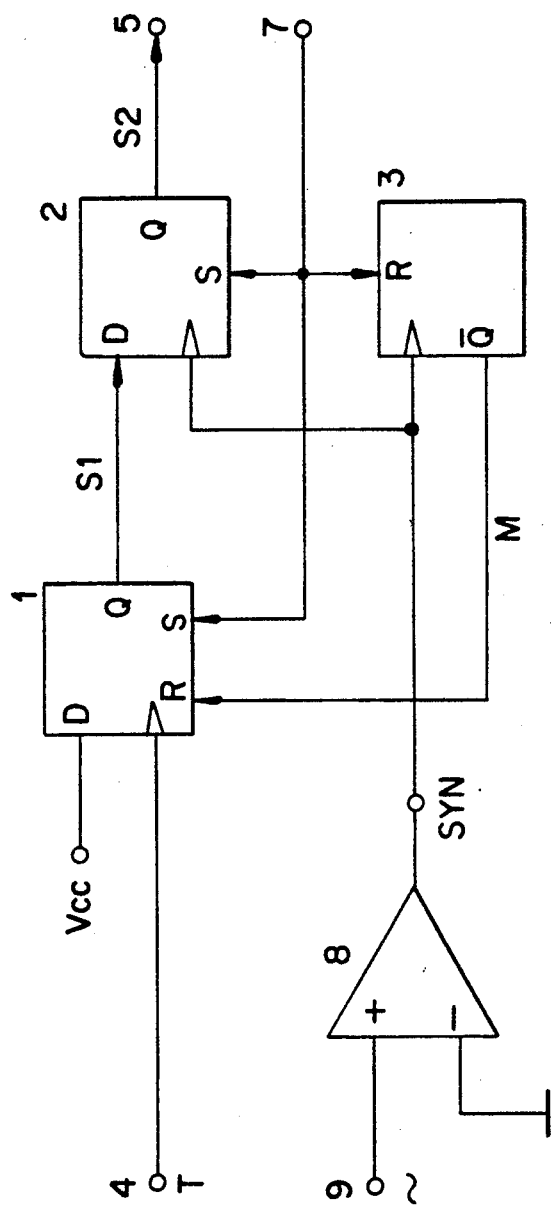

United States Patent [19]

Hauck et al.

[11] Patent Number: 5,028,813
[45] Date of Patent: Jul. 2, 1991

[54] DEVICE FOR MONITORING A CLOCK SIGNAL

[75] Inventors: Dieter Hauck, Eberbach; Karl-Heinz May, Viernheim; Hans Müller, Sandhausen; Jürgen Rehberger, Dossenheim, all of Fed. Rep. of Germany

[73] Assignee: Heidelberger Druckmaschinen A.G., Heidelberg, Fed. Rep. of Germany

[21] Appl. No.: 348,972

[22] Filed: May 8, 1989

[30] Foreign Application Priority Data

May 6, 1988 [DE] Fed. Rep. of Germany ....... 3815531

[51] Int. Cl.$^5$ ...................... H03K 5/13; H03K 3/284; H03K 5/08; H03K 7/00
[52] U.S. Cl. ................................. 307/269; 307/272.1; 307/273; 328/34; 328/63; 328/72
[58] Field of Search ..................... 307/269, 272.1, 273, 307/290, 518; 328/63, 72, 120, 138, 140, 34

[56] References Cited

U.S. PATENT DOCUMENTS

| 4,380,815 | 4/1983 | Clendening . | |
|---|---|---|---|
| 4,467,285 | 8/1984 | Rinaldi | 328/112 |
| 4,672,325 | 6/1987 | Murai | 328/120 |
| 4,737,723 | 4/1988 | Mita . | |
| 4,777,331 | 10/1988 | Borst | 328/120 |

FOREIGN PATENT DOCUMENTS

| 2634867 | 8/1967 | Australia . |
| 2644646 | 4/1983 | Fed. Rep. of Germany . |
| 00825 | 12/1985 | Int'l Pat. Institute . |

Primary Examiner—Stanley D. Miller
Assistant Examiner—Trong Quang Phan
Attorney, Agent, or Firm—Herbert L. Lerner; Laurence A. Greenberg

[57] ABSTRACT

Method of monitoring a clock signal includes bringing a bistable element to a first state through pulses of the clock signal and, upon the occurrence of pulses of a reference signal having a frequency lower than the frequency of the clock signal, scanning the state of the bistable element and outputting it as an output signal, and subsequently setting the bistable element to a second state.

1 Claim, 2 Drawing Sheets

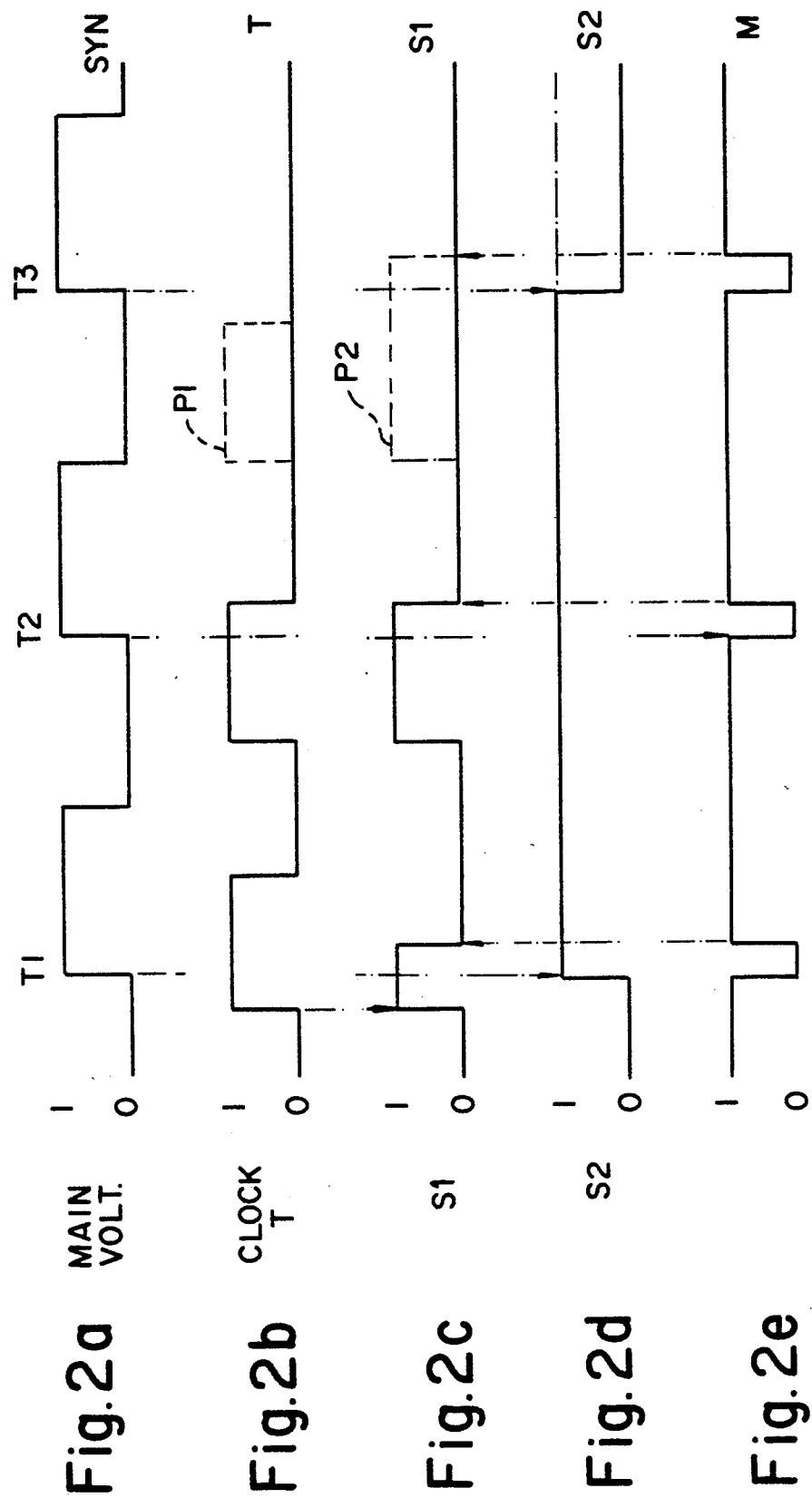

DEVICE FOR MONITORING A CLOCK SIGNAL

The invention relates to a method and device for monitoring a clock signal.

The functioning of electronic control devices frequently depends upon the presence of a clock signal. If there is no clock signal because of a fault in the clock-signal generator, malfunctions may result which may lead to serious damage in individual cases.

It is an object of the invention of the instant application to provide a method of monitoring a clock signal which is implemented with little outlay or expense for circuitry.

With the foregoing and other objects in view there is provided, in accordance with one aspect of the invention, a method of monitoring a clock signal which includes bringing a bistable element to a first state through pulses of the clock signal and, upon the occurrence of pulses of reference signal having a frequency lower than the frequency of the clock signal, scanning the state of the bistable element and outputting it as an output signal, and subsequently setting the bistable element to a second state.

In accordance with another mode of the invention, the bistable element is brought to the first state, and the state of the bistable element is scanned at specified edges of the clock signal and of the reference signal.

In accordance with a further mode, the method includes deriving the reference signal from the main voltage. This results in an especially simple and reliable method of producing the reference signal.

In accordance with another aspect of the invention, there is provided a method of monitoring a clock signal, comprising a first D flip-flop having a clock input for receiving a clock signal, an input connected to a fixed logic level, and an output; a second D flip-flop having an input connected to the output of the first D flip-flop, and having a clock input; a monostable multivibrator having a clock input and an output; and means for supplying a reference signal to the clock inputs of the second D flip-flop and the monostable multivibrator, the output of the second D flip-flop forming the output of the device, and the first D flip-flop having a reset input to which the output of the monostable multivibrator is connected.

In accordance with another feature of the invention, the first and second D flip-flop have respective set inputs, and including means connected to the set inputs of the first and second D flip-flops and to the reset input of the monostable multivibrator for supplying a turn-on reset signal thereto. In control devices which, after being turned on, are brought, moreover, to an initial state by a turn-on reset signal, this added feature ensures the commencement of the monitoring of the clock signal by the device according to the invention immediately after turn-on without any additional effort.

In accordance with a concomitant feature of the invention, the means for supplying a reference signal comprise a threshold-value circuit connected to means for deriving the reference signal from the main voltage.

Other features which are considered as characteristic for the invention are set forth in the appended claims.

Although the invention is illustrated and described herein as embodiment in a method and device for monitoring a clock signal, it is nevertheless not intended to be limited to the details shown, since various modifications and structural changes may be made therein without departing from the spirit of the invention and within the scope and range of equivalents of the claims.

The construccion and method of operation of the invention, however, together with additional objects and advantages thereof will be best understood from the following description of specific embodiment when read in connection with the accompanying drawings, in which:

FIG. 1 is a block diagram of the device for monitoring a clock signal according to the invention; and FIGS. 2(a) to 2(e) are timing diagrams of the signal occuring in the device according to FIG. 1.

Referring now to the drawings and, first, particularly to FIG. 1 thereof, there are shown therein two D flip-flops 1 and 2 a monostable multivibrator 3 forming part of the device according to the invention. A clock signal T, which is to be monitored, is supplied to a clock input of the D flip-flop 1 via an input 4. An input D of the D flip-flop 1 is connected to the operating voltage Vcc. An output Q of the D flip-flop 1 is connected as signal S1 to the input D of the D flip-flop 2, while the output Q of the D flip-flop 2 forms as signal S2 an output 5 of the device. A reference signal SYN is supplied to clock inputs of the D flip-flop 2 and the monostable multivibrator 3. A signal at an output $\overline{Q}$ of the monostable multivibrator 3 is used for resetting the D flip-flop 1 and is sent for this purpose to a dynamic reset input R of the D flip-flop 1. A turn-on reset signal supplied at 7 sets the two D flip-flops 1 and 2 and is additionally fed to a reset input R of the monostable multivibrator 3.

The reference signal SYN is derived from the main voltage by a threshold-value circuit 8, for which purpose an input 9 is supplied with an alternating-current voltage which is drawn form a non-illustrated secondary winding of a main transformer.

The operating principle of the device according to FIG. 1 and the method according to the invention are explained hereinafter with reference to FIGS. 2(a) to 2(e). The signal shown in FIG. 2 is a wave-form signal obtained from the main voltage. With regard to the clock signal T shown in FIG. 2(b), it is assumed that there are two pulses and that there is then no clock signal.

FIG. 2(c) represents the output signal of the D flip-flop 1. It is brought to the value 1 with the leading edge of the clock signal T. On arrival of the leading edge of the reference signal SYN, the value of the output signal S1 of the D flip-flop 1 is transferred to the D flip-flop 2, whereupon the output signal S2 (FIG. 2(d)) of the D flip-flop 2 likewise assumes the value 1. At the same time, the monostable multivibrator 3 (FIG. 1), having an output signal shown in line FIG. 2(e), is clocked. The D flip-flop 1 is reset with the leading edge of an output signal M.

This is repeated as long as the clock signal T is present. If it fails to appear, however, the output signal S1 of the D flip-flop 1 is not set to the value 1, with the result that a 1 cannot be transferred to the D flip-flop 2. The output 5 therefore switches to 0, which may be indicated by a suitable indication device. Depending upon the particular requirements, it is also possible for other measures to be taken, such as the automatic stopping of machine.

The foregoing is description corresponding in substance to German Application No. P 38 15 531.1, dated May 6, 1988, the International priority of which is being claimed for the instant application, and which is hereby made part of this application. Any material discrepancies between the foregoing specification and the aforementioned corresponding German application are to be resolved in favor of the latter.

We claim:

1. Device for performing a mehtod of monitoring a clock signal, comprising a first D-flip-flop having a clock input for receiving a clock signal, an input connected to a fixed logic level, and an output; a second D-flip-flop having an input connected to said output of said first D-flip-flop, and having a clock input; a monostable multivibrator having a clock input and output; and means for supplying a reference signal to said clock inputs of said second D-flip-flop and said monostable multivibrator, said output of said second D-flip-flop forming the output of the device, and said first D-flip-flop having a reset input to which said output of said monostable multivibrator is connected; wherein said means for supplying a reference signal comprise a threshold-value circuit connected to ac-main voltage for deriving said reference signal from the ac-main voltage.

* * * * *